(12) United States Patent
Cox et al.

(10) Patent No.: US 9,874,936 B2
(45) Date of Patent: Jan. 23, 2018

(54) WEARABLE ELECTRONIC DEVICE

(71) Applicants: Christopher David Cox, Shanghai (CN); Benoit Chirouter, Guangzhou Province (CN)

(72) Inventors: Christopher David Cox, Shanghai (CN); Benoit Chirouter, Guangzhou Province (CN)

(73) Assignee: CAPE EVOLUTION LIMITED, Hongkong (HK)

( * ) Notice: Subject to any disclaimer, the term of this patent is extended or adjusted under 35 U.S.C. 154(b) by 509 days.

(21) Appl. No.: 13/922,255

(22) Filed: Jun. 20, 2013

(65) Prior Publication Data

US 2013/0342981 A1    Dec. 26, 2013

Related U.S. Application Data

(60) Provisional application No. 61/662,924, filed on Jun. 22, 2012.

(51) Int. Cl.
| | |
|---|---|
| *H05K 7/14* | (2006.01) |
| *G06F 3/01* | (2006.01) |
| *G06F 3/0488* | (2013.01) |
| *G06F 3/042* | (2006.01) |

(52) U.S. Cl.
CPC .............. *G06F 3/017* (2013.01); *G06F 3/012* (2013.01); *G06F 3/042* (2013.01); *G06F 3/0488* (2013.01); *H05K 7/14* (2013.01); *G06F 2200/1637* (2013.01); *G06F 2203/04106* (2013.01)

(58) Field of Classification Search
CPC ......... H05K 7/14; G06F 3/0488; G06F 3/012; G06F 3/017; G06F 3/042; G06F 2200/1637; G06F 2203/04106
USPC ........................................ 361/679.01, 679.03
See application file for complete search history.

(56) References Cited

U.S. PATENT DOCUMENTS

| | | | | |
|---|---|---|---|---|
| 5,606,743 | A  * | 2/1997 | Vogt et al. ..................... | 455/347 |
| 7,784,935 | B2 * | 8/2010 | Jackson et al. ............... | 351/158 |
| 8,109,629 | B2 * | 2/2012 | Howell et al. ................ | 351/158 |
| 8,491,118 | B2 * | 7/2013 | Waters .......................... | 351/158 |
| 2010/0302502 | A1 * | 12/2010 | Ahn .............................. | 351/158 |
| 2011/0213664 | A1 * | 9/2011 | Osterhout et al. ......... | 705/14.58 |
| 2013/0250503 | A1 * | 9/2013 | Olsson et al. ........... | 361/679.03 |

* cited by examiner

*Primary Examiner* — Bernard Rojas
(74) *Attorney, Agent, or Firm* — JCIPRNet

(57) ABSTRACT

An electronic device including a frame and a plurality of capsules is provided. The frame is configured to be wearable on a user, and the frame includes a bridge portion having a first mountable section, a first arm portion having a second mountable section, and a second arm portion having a third mountable section. The plurality of capsules is configured to be mounted on the first mountable section, the second mountable section, and the third mountable section of the frame. The bridge portion is configured to be supported by the nose of a user, the first arm portion has a first free end supported by an ear of the user, and the second arm portion has a second free end supported by the other ear of the user.

15 Claims, 14 Drawing Sheets

WEARABLE ELECTRONIC DEVICE

CROSS-REFERENCE TO RELATED APPLICATION

This application claims the priority benefits of U.S. provisional application Ser. No. 61/662,924, filed on Jun. 22, 2012. The entirety of the above-mentioned patent application is hereby incorporated by reference herein and made a part of this specification.

BACKGROUND

Technical Field

The invention relates generally to an electronic device, and more particularly, to an electronic device including a plurality of mountable capsules.

Related Art

Due to advancements in imaging technologies, camera systems have been utilized to capture various activities. However, when it comes to wearable electronic devices, such as cameras worn by a participant in an activity so that the hands are free to participate in the activity, these tend to be bulky and unaesthetic. Moreover, these wearable electronic devices may cause discomfort to the user while lacking the discreetness needed in some activities. Therefore, a wearable electronic device that is both stylish, discreet, and comfortable is highly desirable.

SUMMARY

Several exemplary embodiments accompanied with figures are described in detail below to further describe the invention in details.

An embodiment of the invention provides an electronic device, including a frame and a plurality of capsules. The frame is configured to be wearable on a user, and the frame includes a bridge portion having a first mountable section, a first arm portion having a second mountable section, and a second arm portion having a third mountable section. The capsules are configured to be mounted on the first mountable section, the second mountable section, and the third mountable section of the frame.

Another embodiment of the invention provides an electronic device, including a frame and a plurality of capsules. The frame is configured to be wearable on a user, and the frame includes a bridge portion having a first mountable section, a first arm portion having a second mountable section, and a second arm portion having a third mountable section. The capsules are configured to be mounted on the first mountable section, the second mountable section, and the third mountable section of the frame, in which the capsules are connected to each other by an external cable.

Another embodiment of the invention provides an electronic device, including a host structure and a plurality of capsules. The host structure includes a first mountable section, a second mountable section, and a third mountable section. The capsules are configured to be mounted on the first mountable section, the second mountable section, and the third mountable section of the host structure.

In summary, through the use of capsules enclosing electronics and imaging units mounted on a host structure resembling normal gear used in an activity, embodiments of the invention have provided wearable electronic devices that are both stylish, discreet, and comfortable. Accordingly, the user can achieve point-of-view and hands-free image or video capture without being burdened by cumbersome equipment.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the invention.

DETAILED DESCRIPTION OF DISCLOSED EMBODIMENTS

Figure 1A:
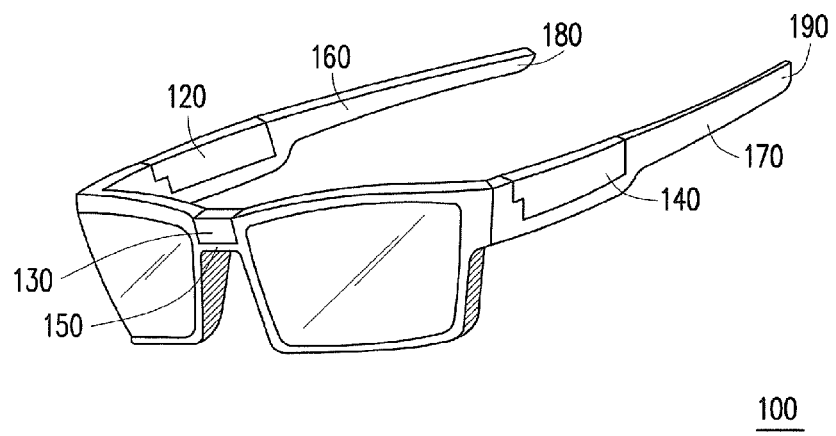
FIGS. 1A and 1B are schematic views of an electronic device according to an embodiment of the invention.

Some embodiments of the present application will now be described more fully hereinafter with reference to the accompanying drawings, in which some, but not all embodiments of the application are shown. Indeed, various embodiments of the application may be embodied in many different forms and should not be construed as limited to the embodiments set forth herein; rather, these embodiments are provided so that this disclosure will satisfy applicable legal requirements. Like reference numerals refer to like elements throughout.

Figure 1B:
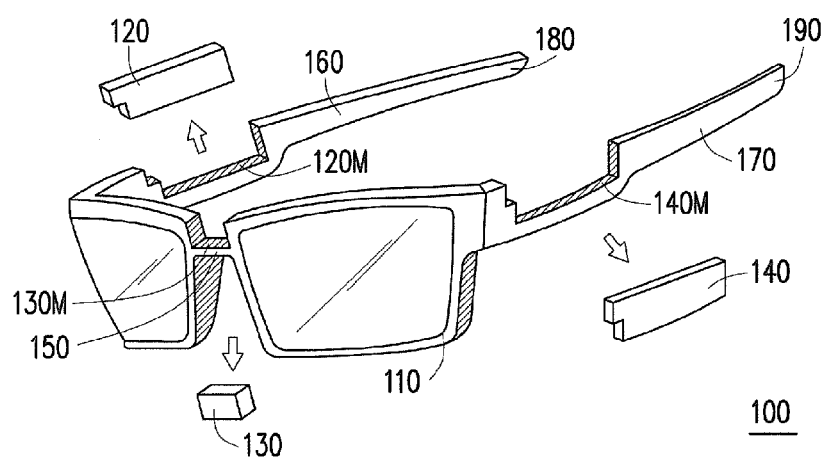

FIGS. 1A and 1B are schematic views of an electronic device according to an embodiment of the invention. With reference to FIGS. 1A and 1B, an electronic device 100 includes a frame 110 configured to be wearable on a user. The frame 110 includes a bridge portion 150 having a first mountable section 130M, a first arm portion 160 having a second mountable section 120M, and a second arm portion 170 having a third mountable section 140M. Moreover, the bridge portion 150 is configured to be supported by the nose of the user, the first arm portion 160 has a first free end 180 supported by an ear of the user, and the second arm portion 170 has a second free end 190 supported by the other ear of the user. As shown in FIGS. 1A and 1B, in the present embodiment, the electronic device 100 includes covers 120, 130, and 140 configured to be respectively mounted on the first mountable section 130M, the second mountable section 120M, and the third mountable section 140M. In FIG. 1A, the covers 120-140 are mounted in the respective mountable sections 120M-140M, whereas in FIG. 1B, the covers 120-140 are shown as detached from the electronic device 100. As shown in FIG. 1A, the covers 120-140 may be mounted so as to provide an overall aesthetic view of an eyewear, for example.

Figure 2A:
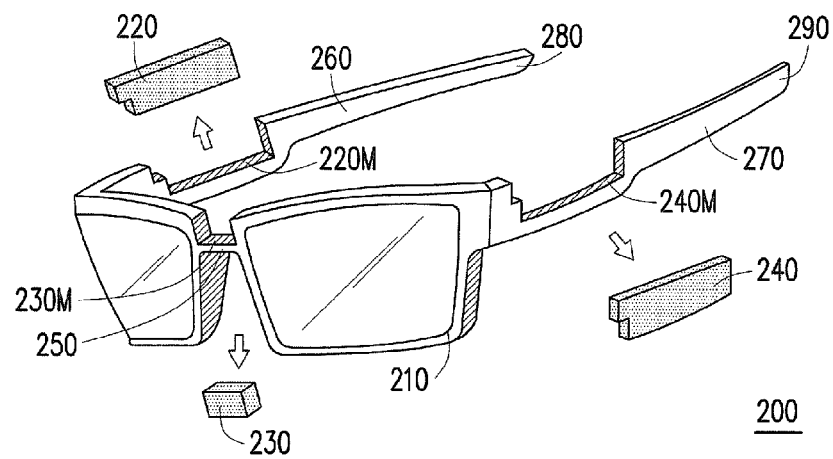
FIGS. 2A and 2B are schematic views of an electronic device according to an embodiment of the invention.
Figure 2B:
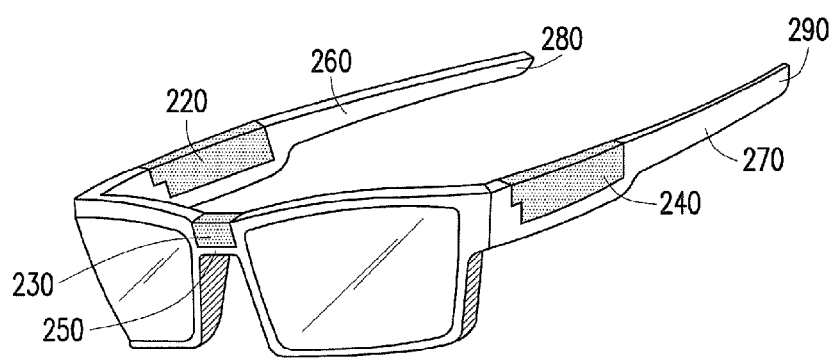

When the covers 120-140 in the electronic device 100 are detached, a plurality of capsules enclosing components of the electronic device providing enhanced capabilities may be mounted in the respective mountable sections of the frame. FIGS. 2A and 2B are schematic views of an electronic device according to an embodiment of the invention. FIG. 2A illustrates an electronic device 200 in which the difference compared to the electronic device 100 is that a plurality of capsules 220, 230, and 240 are being mounted after the covers have been detached. Specifically, in the present embodiment, the capsules 220-240 are configured to be mounted on a first mountable section 230M, a second mountable section 220M, and the third mountable section 240M of a frame 210.

FIG. 2B illustrates the electronic device 200 with the capsules 220-240 mounted and integrated with the overall structure of the frame 210 of the electronic device 200, such that the electronic device 200 maintains the aesthetic feel of an eyewear to the user. The frame 210 including the bridge portion 250, the first arm portion 260, and the second arm portion 270 may be formed of a plastic material and/or a metal material. Furthermore, the frame 210 may be partially hollow. For example, when the frame 210 is partially hollow, the frame 210 may include electronic connections (not shown) integrated in the bridge portion 250, the first arm portion 260, and the second arm portion 270 for electrical connection to the mounted capsules 220, 230, and 240. In the present embodiment, the capsules 220 and 240 have substantially a same weight. Balancing the weight of the capsules 220 and 240 may be achieved by an iterative process in which the volumes of different components inside the capsules, such as a printed circuit board assembly (PCBA) and a battery, are first defined. The PCBA may be manufactured to match the dimensions of the battery, for example. The weights of the components may be compared, and the components inside the capsules 220 and 240 may be distributed to balance the weight of the capsules 220 and 240 mounted on the second mountable section 220M and the third mountable section 240M. However, the electronic device in other embodiments of the invention may be balanced in weight by other methods not departing from the spirit of the invention. Accordingly, the user of the electronic device 200 does not feel discomfort due to different weight force being exerted on the head and ears of the user.

According to an embodiment of the invention, the capsules 220-240 may respectively enclose an imaging unit, an controller, and a battery. In the present embodiment, the imaging unit is enclosed by the capsule 230, the controller is enclosed by the capsule 220, and the battery is enclosed by the capsule 240. However, other embodiments of the invention may enclose other components to provide different functions for the electronic device 200 according to a specific activity. For example, the capsule 240 enclosing the battery may also include a memory card slot, and both the capsules 220 and 240 may include heat dissipation elements.

Moreover, the imaging unit enclosed by the capsule 230 may include additional optical elements or sensors needed for the specific activity.

In some embodiments, the capsules 220-240 are mounted on the first mountable section 230M, the second mountable section 220M, and the third mountable section 240M by a specific locking mechanism. Moreover, the specific locking mechanism requires a specific orientation for each of the mountable sections 220M-240M. For example, with reference to FIG. 2A, the first mountable section 230M on the bridge section 250, the second mountable section 220M on the first arm portion 260, and the third mountable section 240M on the second arm portion 270 of the frame 2 may include structural walls machined at angles such that a specific orientation is required in order for the capsules 220-240 to be mounted on the respective mountable sections 220M-240M. As shown in FIG. 2A, the second and third mountable sections 220M and 240M contain a structural wall having a laddered shape, so that a specific orientation is required for mounting. Moreover, the specific orientation required by the mounting sections 220M-240M ensures that, for example, the imaging unit enclosed by the capsule 230 can capture photos or videos accurately and in the proper orientation. Furthermore, specific orientation also ensures that the electrical connections to the controller and the battery enclosed in the capsules 220 and 240 are secure. However, the invention is not limited by the locking mechanism described, and other mechanisms for mounting the capsules 220-240 such as via clipping, snapping, slidding, or magnetic mechanisms may also be possible.

Figure 3A:
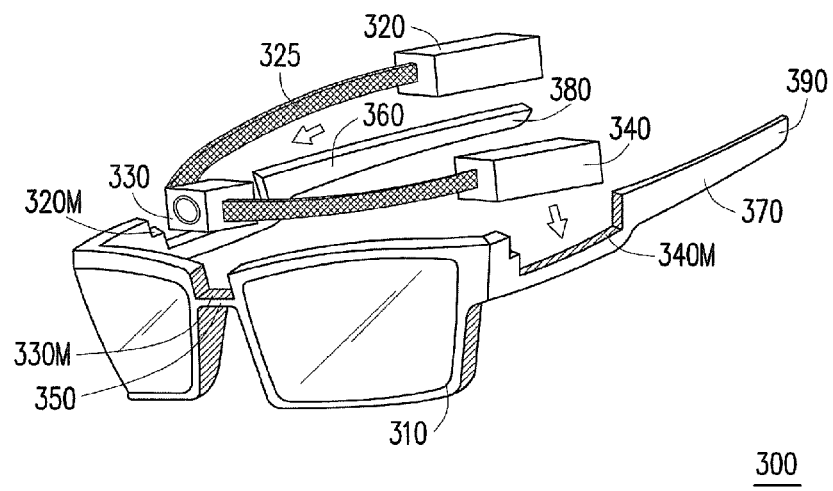
FIGS. 3A and 3B are schematic views of an electronic device according to another embodiment of the invention.
Figure 3B:
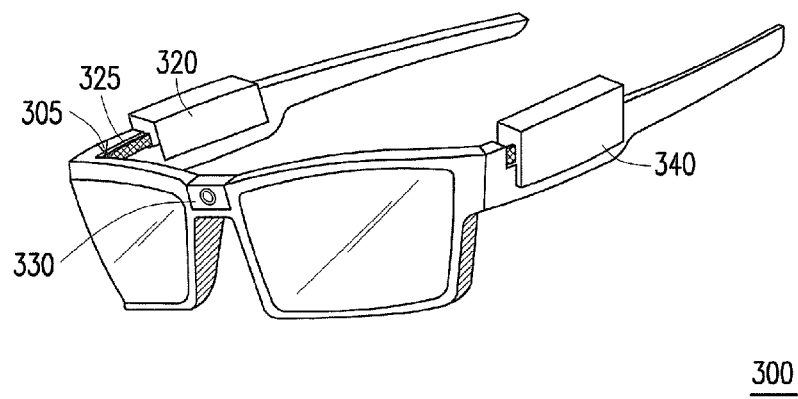

FIGS. 3A and 3B are schematic views of an electronic device according to another embodiment of the invention. With reference to FIGS. 3A and 3B, an electronic device 300 of FIGS. 3A and 3B is different from the electronic device 200 of FIGS. 2A and 2B in that, the capsules 320, 330, and 340 may be connected to each other by a external cable 325. The external cable 325 may be an electronic cable, an optical cable, or a flexible printed circuit (FPC) cable containing integrated wires for electrical connection between the capsules. When the capsules 320-340 connected by the external cable 325 are respectively mounted on the first mountable section 330M, the second mountable section 320M, and the third mountable section 340M, the external cable 325 is disposed on a side of the frame 310 facing the user, as shown in FIG. 3B. Accordingly, since the frame 310 in the present embodiment do not require integrated wiring for the electrical connections of the capsules 320-340, the electronic device 300 can be adaptable to be various types of eyewear, googles, helmets, belts, and head straps, for example. Moreover, manufacturers may be able to produce frames mountable by the capsules 320-340 at a lower cost without the integrated wirings. The frame may also be made of a metal and contain integrated heat dissipating fins to help with heat dispersion.

Figure 4:
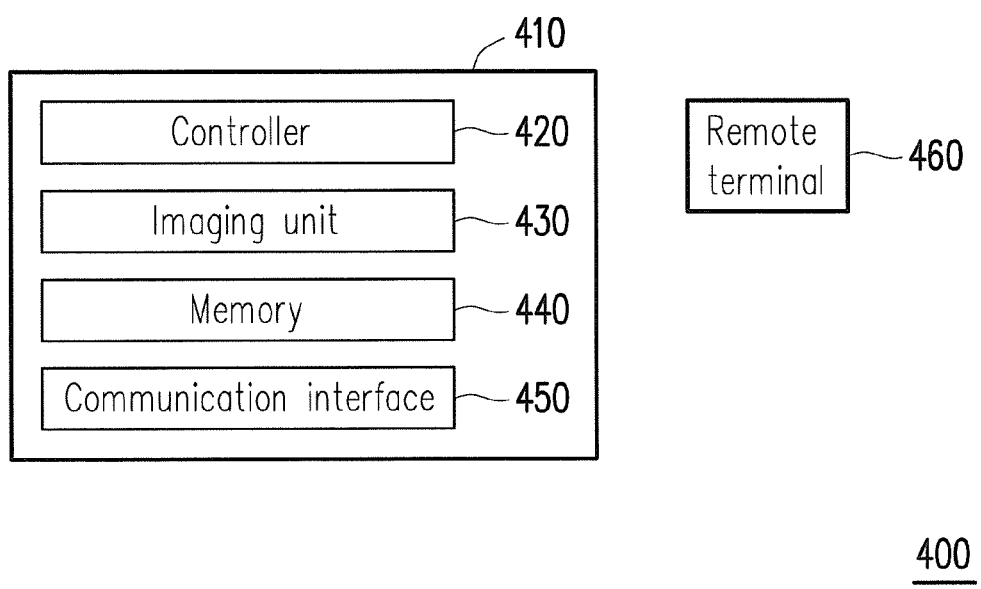
FIG. 4 illustrates a system for communicating data between a remote terminal and an electronic device according to an embodiment of the invention.

FIG. 4 illustrates a system for communicating data between a remote terminal and an electronic device according to an embodiment of the invention. With reference to FIG. 4, a communication system 400 of the present embodiment includes a device 410 and a remote terminal 460. The device 410 may be any type of device that is capable of receiving data and executing instructions based on the data. For example, the device 410 may be the electronic device 200 shown in FIGS. 2A and 2B, the electronic device 300 shown in FIGS. 3A and 3B, or any device having the capsules 320-340 connected by the external cable 325 mounted. The device 410 may include a controller 420, an imaging unit 430, a memory 440, and a communication interface 450. The controller 420, the imaging unit 430, the memory 440, and the communication interface 450 may be enclosed by the capsules shown in the electronic devices 200 and 300, for example. The remote terminal 460 may be any type of computing device having a transceiver including a desktop computer, laptop computer, a cellular phone, or tablet computing device, or any device that is configured to transmit data to the device 410. Furthermore, the communication interface 450 of the device 410 and the remote terminal 460 may contain hardware to enable a communication link with each other, such as transmitters, receivers, antennas, etc. The controller 420 in the device 410 may receive data, such as a command instruction, from the remote terminal 460 through the communication interface 450. For example, the remote terminal 460 may transmit data to the device 410 instructing the device 410 to capture an image or a video. The controller 420 would then perform operations from program codes stored in the memory 440 in order to control the imaging unit 430 (e.g. enclosed in the capsule 330) to capture the image or video. The captured image file would then be stored back in the memory 440 or transmitted back to the remote terminal 460, for example. It should be noted that, the imaging unit 430 may also contain optical and electrical elements which enable the display of the captured image or video to the user wearing the device 410 in real time, such as by projection in front of the user. In another embodiment, the communication interface 450 may contain notification elements (e.g. light-emitting diodes) which alert the user of various functions of the device 410 and is viewable by the user wearing the device 410.

It should be further noted that a wired or wireless communication link may be established between the device 410 and the remote terminal 460. For example, the communication link may be a wired serial bus such as a universal serial bus or a parallel bus. A wired connection may be a proprietary connection as well. The wireless communication link may be established by using, e.g., Bluetooth radio technology, communication protocols described in IEEE 802.11 (including any IEEE 802.11 revisions), cellular technology (such as GSM, CDMA, UMTS, EVDO, WiMAX, or LTE), or Zigbee technology, among other possibilities. The remote terminal 460 may be accessible via the Internet and may include a computing cluster associated with a particular web service (e.g., social-networking, photo sharing, address book, etc.). Furthermore, the controller 420, the imaging unit 430, the memory 440, and the communication interface 450 enclosed by the capsules 220-240 or 320-340 may also communicate to each other by a wireless link using the aforementioned techniques.

Figure 5A:
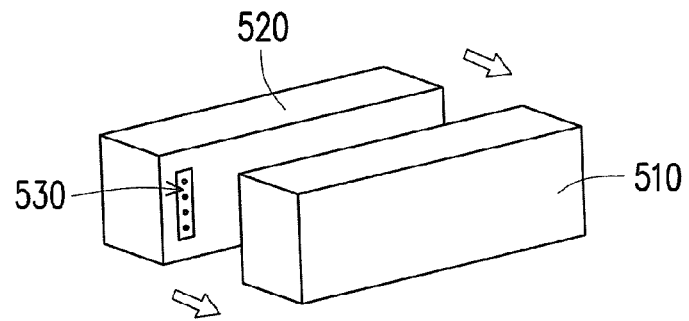
FIGS. 5A and 5B are schematic views of expandable capsules according to an embodiment of the invention.
Figure 5B:
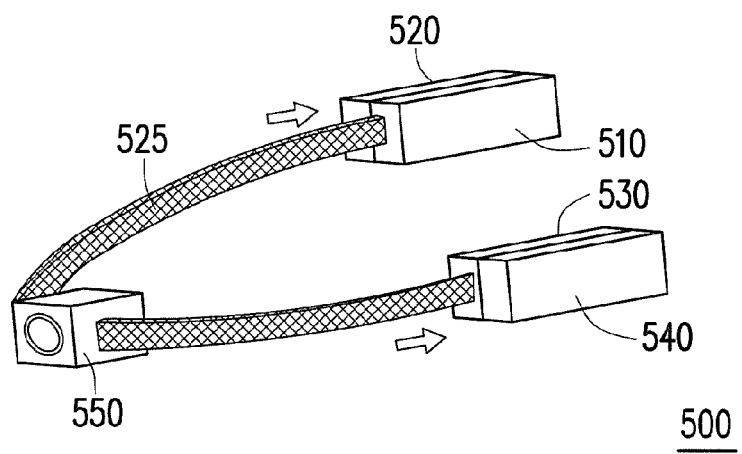

FIGS. 5A and 5B are schematic views of expandable capsules according to an embodiment of the invention. With reference to FIGS. 5A and 5B, a capsule 510 and a capsule 520 of the present embodiment may include an external connector 530 for attaching additional capsules. The external connector 530 may enable electrical connection between the capsules 510 and 520 via a wired serial bus such as a universal serial bus or a parallel bus. As shown in FIG. 5B, when additional capsules 520 and 540 are attached to the capsules 510 and 530, expanded functions of the electronic device 500 may be enabled. For example, the capsule 520 may enclose a Global Positioning System (GPS) providing location and time information to the controller enclosed in the capsule 510. Moreover, the capsule 540 may enclose a secondary battery providing more power to the electronic device 500. However, other ways of expanding the functionalities provided by the elements enclosed by the capsules are possible, such as configuring an additional imaging unit enclosed in a capsule 550 on the electronic device 500 such that a 3D video recording function is achieved together with an original imaging unit on the electronic device 500. Furthermore, a lens or a lens set may be enclosed by the capsule 550 or disposed outside of the capsule 550 to enable a particular application of the electronic device 500. Such a lens or lens set may be one which expands the field of view, corrects for aberrations, or provides telescoping or magnifying functions for the electronic device 500, although the invention is not limited thereto.

Figure 6A:
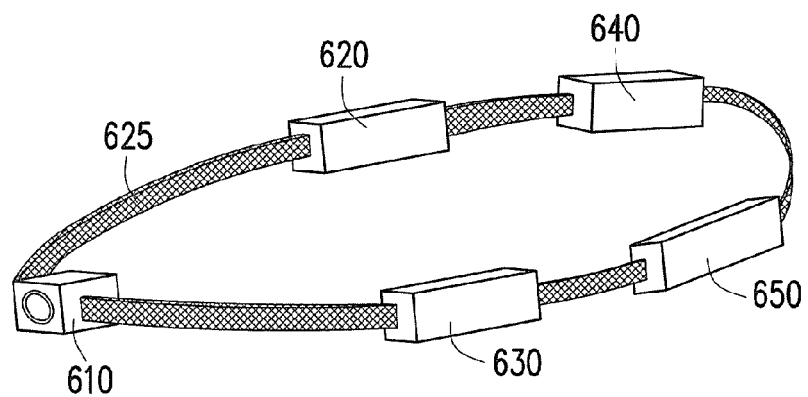
FIGS. 6A and 6B are schematic views of expandable capsules according to an embodiment of the invention.
Figure 6B:
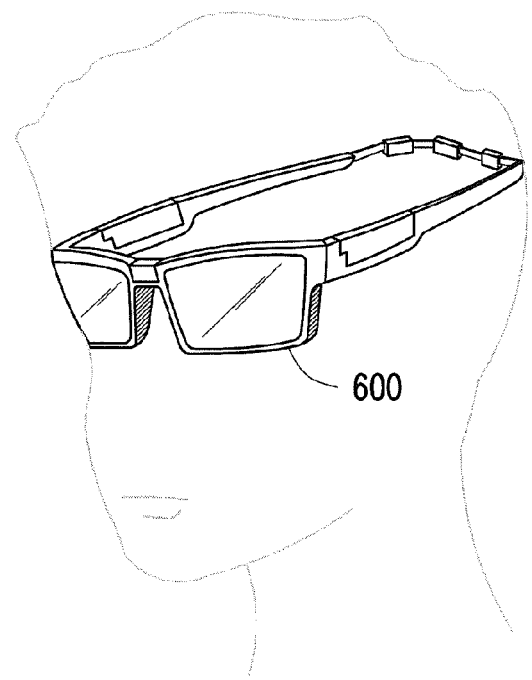

FIGS. 6A and 6B are schematic views of expandable capsules according to an embodiment of the invention. With reference to FIG. 6A, the cable 625 connecting the capsules 610, 620, and 630 is detachable for attachment to additional capsules 640 and 650, and the cable 625 contain integrated wires for electrical connection between the capsules 610-650. As shown in FIG. 6B, the electronic device 600 including the expanded capsules 640 and 650 can be worn as a head band around the back of the head of the user, for example.

Figure 7A:
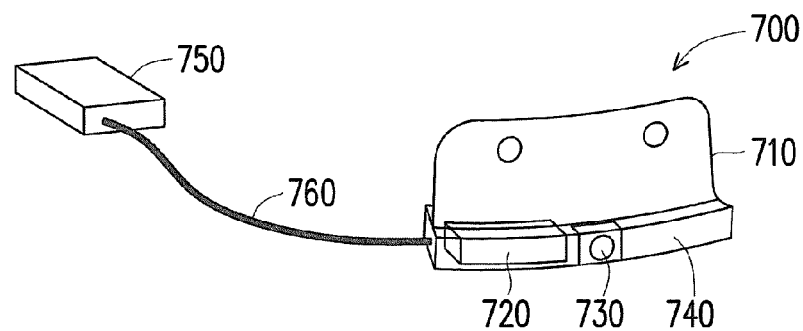
FIGS. 7A-7C are schematic views of an electronic device according to another embodiment of the invention.
Figure 7B:
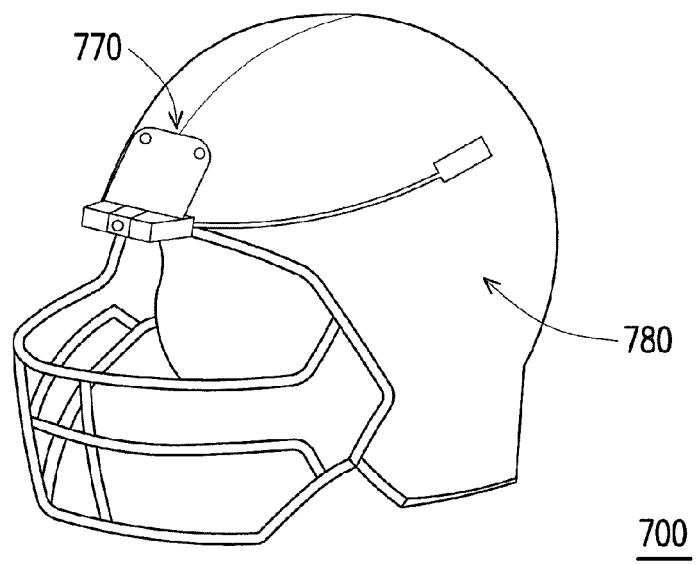
Figure 7C:
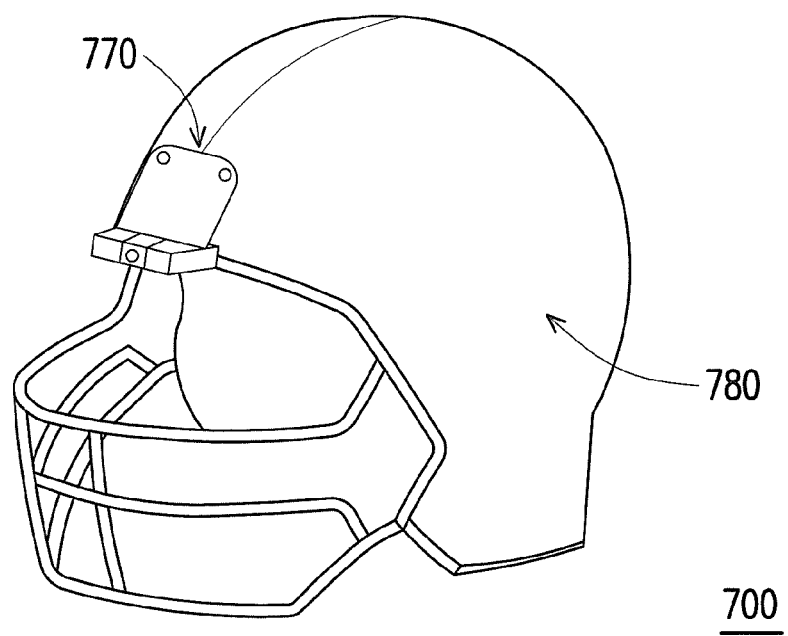

As previously described, the electronic device 300 can be adaptable to be various types of eyewear, googles, helmets, belts, and head straps, or other types of host structures. FIGS. 7A-7C are schematic views of an electronic device according to another embodiment of the invention. With reference to FIGS. 7A and 7B, an electronic device 700 includes a frame 710, a body 740, and the capsules 720, 730, and 750 connectable by a cable 760 containing integrated wires for electrical connection between the capsules 720, 730, and 750. As shown in FIG. 7B, the electronic device 700 may also include a host structure 780 for mounting the frame 710, the body 740, and the capsules 720, 730, and 750. The host structure 780 may be an American football helmet, for example, although the invention is not limited thereto as long as the capsules can be mounted on the host structure. Generally speaking, the electronic device 700 is capable of performing similar functions as the electronic devices 200, 300, 500, and 600. Moreover, the electronic device 700 may also be used as the device 410 in the communication system 400 depicted in FIG. 4. For example, the capsule 750 of the electronic device 700 may include the communication interface 450 to communicate with the remote terminal 460 through a wired or wireless communication link as previously described. The body 740 of the electronic device 700 may contain additional capsules enclosing an auxiliary battery, for example. The capsules 720, 730, and 750 may be mounted on a mountable section 770 of the host structure 780 by screws, for example. However, the capsules 720, 730, and 750 may also be respectively mounted on the host structure 780 by separate mountable sections on the host structure 780. Furthermore, as shown in FIG. 7C, the capsules 720, 730, and 750 may be electrically connected by integrated wires embedded in the host structure 780, such that the cable 760 is integrated within the host structure 780 for impact protection and improved aesthetics, for example. With the electronic device 700 mounted on the host structure 780 as shown in FIG. 7B or 7C, real-time image or video of a sporting activity through the viewpoint of the helmet user can be dynamically captured without hand operation.

Figure 8:
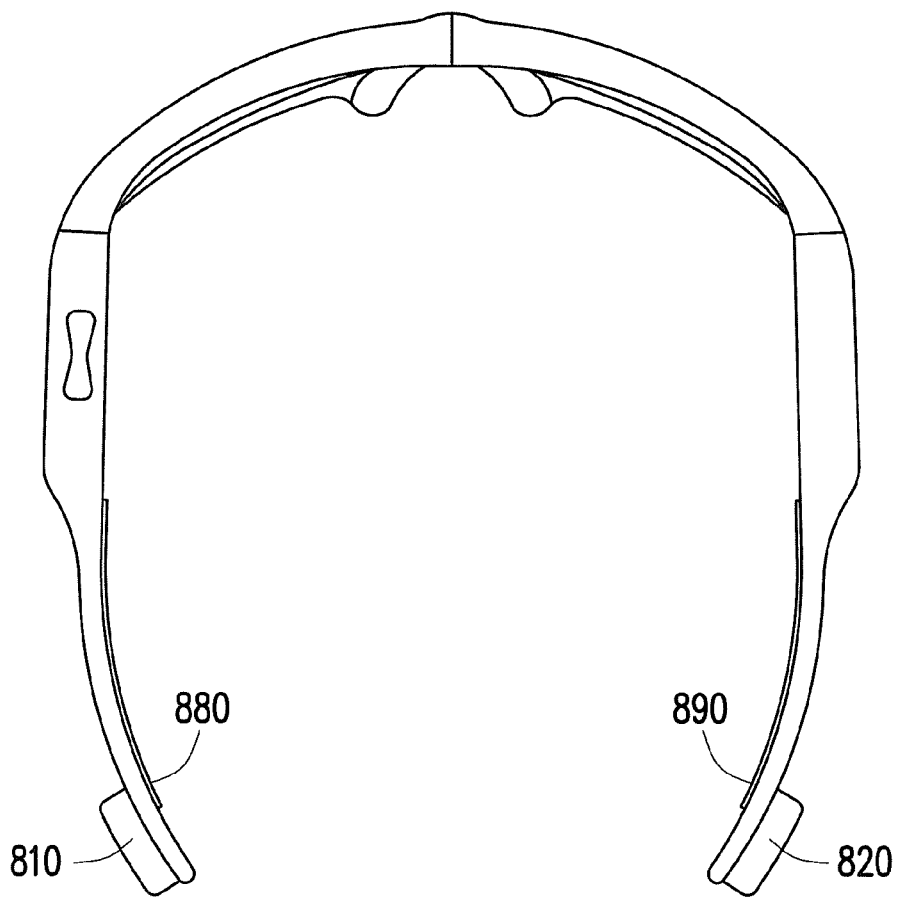
FIG. 8 is a schematic view of an electronic device according to another embodiment of the invention.

It should be appreciated that, in the electronic device according to other embodiments of the invention, the capsules are not restricted to being mounted in the configurations depicted earlier in the description. FIG. 8 is a schematic view of an electronic device according to another embodiment of the invention. With reference to an electronic device 800 depicted in FIG. 8, the capsules 810 and 820 may be respectively disposed on mountable sections (not drawn) on an outer surface of a first free end 810 and a second free end 820. Accordingly, a user can comfortably wear the electronic device 800 because the capsules 810 and 820 can be configured to have substantially a same weight and to rest comfortably behind the ears. Moreover, the capsules 810 and 820 may respectively enclose a communication module and an auxiliary battery to further expand the capabilities of the electronic device 800.

Figure 9A:
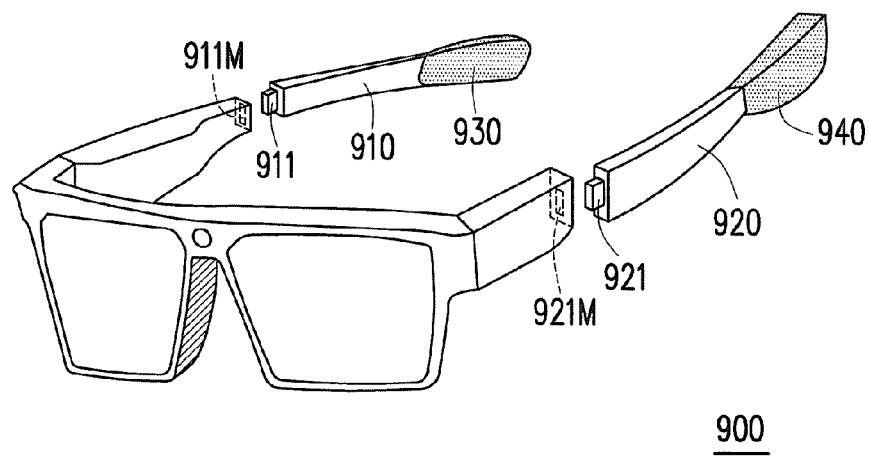
FIG. 9A-9C are schematic views of an electronic device according to another embodiment of the invention
Figure 9B:
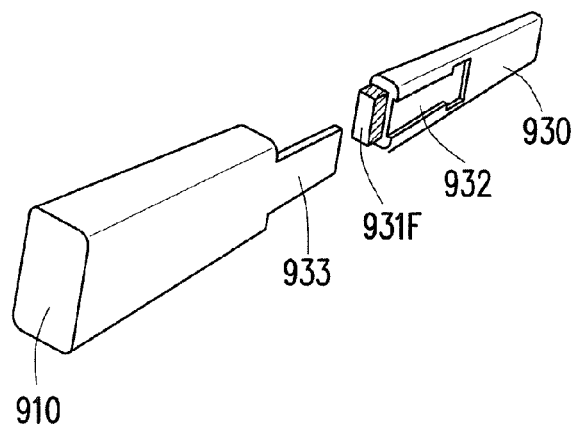
Figure 9C:
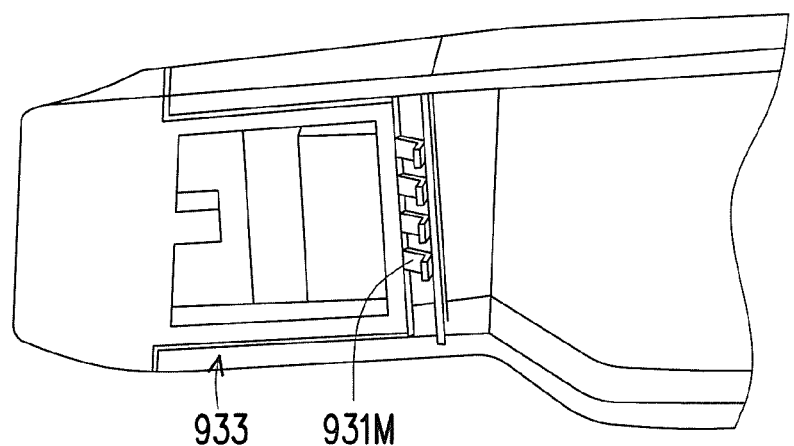

FIG. 9A-9C are schematic views of an electronic device according to another embodiment of the invention. With reference to FIGS. 9A-9C, an electronic device 900 may be configured such that the capsules 910 and 920 are respectively mounted to the mountable sections 911M and 921M by the connectors 911 and 921 to form the arm portions of the electronic device 900. In the example depicted in FIG. 9A, the connectors 911 and 921 are in the male configuration and the mountable sections 911M and 921M are in the female configuration, although in other embodiments, one or both of the connectors 911 and 921 may be in the female configuration to connect to the mountable sections 911M and 921M in the male configuration. The connectors 911 and 921 may be a standard USB connector such as type A, B, mini-A, mini-B, micro-A, or micro-B, a standard micro HDMI connector, or other suitable types of connectors. The capsules 910 and 920 may enclose any of the components disclosed in previous embodiments of the electronic device, or other components such as a speaker employing bone conduction or other conduction technologies, removable memory storage, touch sensors, accelerometers, and gyroscopes. The capsules 910 and 920 may also be configured to have substantially a same weight by the process described earlier. Moreover, the capsules 910 and 920 may be further expanded by respectively mounting additional capsules 930 and 940 thereto, which also serve as the free ends of the electronic device 900 worn on the ears of the user. With reference to FIGS. 9B and 9C, the capsule 930 is shown detached and mounted to the capsule 910. The capsule 930 may be mounted to a connector 931M of the capsule 910 by a connector 931F. Moreover, the connector 931M of the capsule 910 may be optionally encased in a mechanical casing 933 and inserted into a groove 932 of the capsule 930 to support the weight of the electronic device 900. However, the mechanical casing 933 is not necessary if the connectors 931M and 931F can support the mechanical stress of the connection.

Figure 10A:
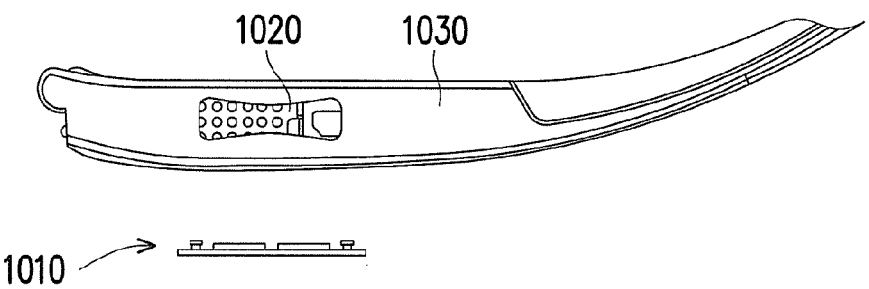
FIGS. 10A and 10B depict a heat conduction mechanism of an electronic device according to an embodiment of the invention.
Figure 10B:
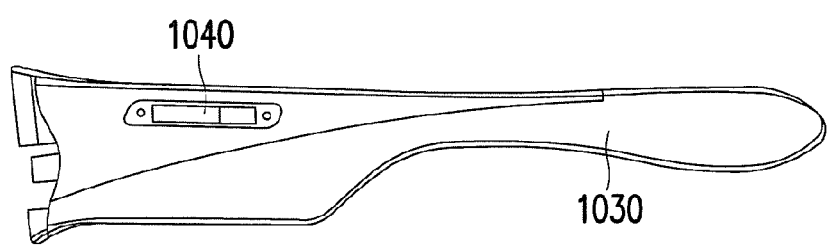
Figure 11:
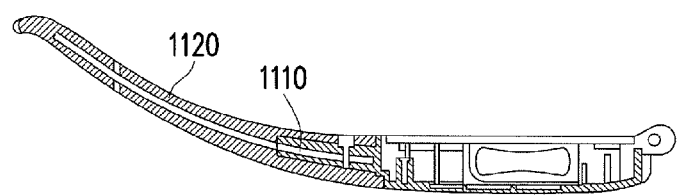
FIG. 11 depicts another heat conduction mechanism of an electronic device according to an embodiment of the invention.

For maximum comfort to the user, heat conduction plays an important role for the wearable electronic device. FIGS. 10A and 10B depict a heat conduction mechanism of an electronic device according to an embodiment of the invention. With reference to FIG. 10A showing a top view of an arm portion 1030 of the electronic device, the arm portion 1030 may be configured with a plurality of cover plates 1010 and 1020 serving as heat sinks to promote heat conduction. The cover plates 1010 and 1020 may be made of a metallic material, such as aluminum or a zinc alloy. The cover plate 1020 may include metallic strips or bumps to promote heat dissipation, and the entire cover plate may be configured in a bottle shape to serve as a function button on the arm portion 1030 of the electronic device. The cover plate 1010 may be mounted on a mountable section 1040 shown in FIG. 10B, which shows a side view of the arm portion 1030. Once the cover plate 1010 is inserted in the mountable section 1040, heat from the electronic device can be rapidly conducted by thermal pads disposed in the arm portion 1030 of the electronic device and directed outside toward the cover plates 1010 and 1020. FIG. 11 depicts another heat conduction mechanism of an electronic device according to an embodiment of the invention. With reference to FIG. 11, a metal strip 1010 is sandwiched between a mechanical casing of an arm portion of the electronic device. The metal strip 1010 may form a heat conduction path with the cover plates 1010 and 1020 in FIGS. 10A and 10B to direct heat away from enclosed components such a PCBA, a battery, or a controller, for example, ensuring maximum comfort for the user of the electronic device.

Figure 12:
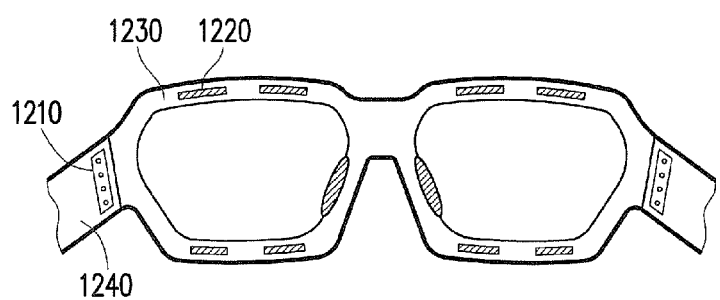
FIG. 12 depict indicator systems of an electronic device according to an embodiment of the invention.

FIG. 12 depicts an indicator system of an electronic device according to an embodiment of the invention. In the electronic device shown in FIG. 12, a plurality of light indicators 1210 may be disposed on a surface of an arm portion 1240 of the electronic device facing the user. Moreover, a plurality of light indicators 1220 may be integrated in a lens frame 1230 facing the user. The light indicators 1210 and 1220 may be a combination of light emitting diodes (LEDs), fiber optics, or other types of light guides. The light indicators 1210 and 1220 may convey information such as an operating mode of the electronic device to the user through a specific combination of blinking light sequences, blinking duration, blinking patterns, and light colors. The light indicators 1210 and 1220 may also convey information according to images or videos captured by an imaging unit enclosed in a capsule of the electronic device. The images and videos may be captured from the remote terminal shown in FIG. 4, and the remote terminal may be a smartphone, a tablet, other wearable electronic devices, or from a scannable stationary or dyanmic target. Moreover, at least one the light indicators 1210 and 1220 may guide light toward the lenses of the electronic device, allowing the user to see the information conveyed by the light indicators without removing the electronic device.

Figure 13:
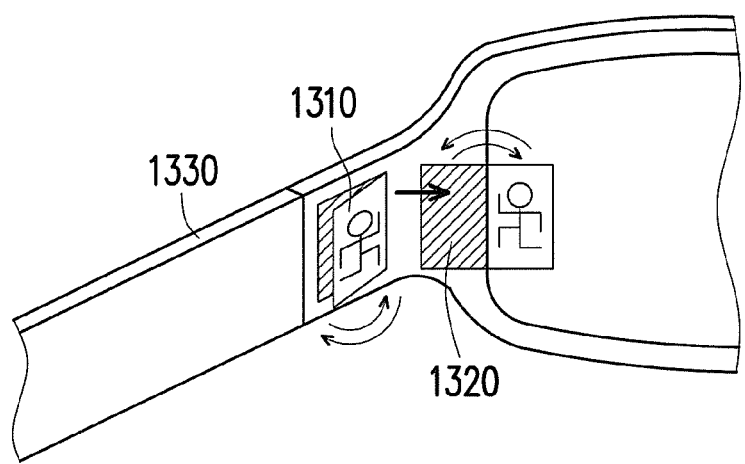
FIG. 13 depicts another indicator system of an electronic device according to an embodiment of the invention.

FIG. 13 depicts another indicator system of an electronic device according to an embodiment of the invention. In the electronic device shown in FIG. 13, a foldable display 1310 and a foldable mirror system 1320 are disposed on an arm portion 1330 of the electronic device. The display 1310 may be a liquid crystal display or other suitable display mediums, for example. The display 1310 and mirror system 1320 may be configured at an angle by a mechanical frame integrated in the arm portion 1330 such that images on the display 1310 may be reflected and viewed on the mirror system 1320. When not in use, the display 1310 and the mirror system 1320 may be automatically or manually returned to the arm portion 1330 of the electronic device. The indicator system depicted by FIG. 13 may be configured on one arm portion or both arm portions of the electronic device.

In view of the foregoing, through the use of capsules enclosing electronics and imaging units mounted on a host structure resembling normal gear used in an activity, embodiments of the invention have provided wearable electronic devices that are both stylish, discreet, and comfortable. Accordingly, the user can achieve point-of-view and hands-free image or video capture without being burdened by cumbersome equipment.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. An electronic device, comprising:
 a frame configured to be wearable on a user, the frame comprising a bridge portion, a first arm portion having a first distal end mountable section, and a second arm portion having a second distal end mountable section;

a plurality of first capsules configured to be detachably mounted on the first distal end mountable section and the second distal end mountable section, wherein each of the first capsules has a first end and a second end opposite to each other, and the first end is detachably mounted to the frame; and a plurality of second capsules, each configured to be respectively detachably mounted on the second end of the corresponding first capsule, wherein the plurality of first and second capsules respectively encloses an imaging capture unit, an controller, a communication interface, or a battery, wherein the imaging capture unit is configured to capture images.

2. The electronic device according to claim 1, wherein the bridge portion is configured to be supported by the nose of a user, the first arm portion has a first free end supported by an ear of the user, and the second arm portion has a second free end supported by the other ear of the user.

3. The electronic device according to claim 1, wherein the frame comprises electronic connections integrated in the bridge portion, the first arm portion, and the second arm portion for electrical connection to the mounted capsules.

4. The electronic device according to claim 1, wherein the first capsules mounted on the second distal end mountable section and the first distal end mountable section are configured to have substantially a same weight by defining the volumes of the components inside the first capsules mounted on the second distal end mountable section and the first distal end mountable section, matching the dimensions of the components, comparing the weights of the components, and distributing the components to balance the weight of the first capsules mounted on the second distal end mountable section and the first distal end mountable section.

5. The electronic device according to claim 1, wherein the electronic device further comprises:

a plurality of light indicators disposed on a surface of the frame of the electronic device facing the user; and a plurality of covers configured to be respectively detachably mounted on the first distal end mountable section and the second distal end mountable section when the first capsules are not mounted.

6. The electronic device according to claim 1, wherein each of the first capsules comprises an external connector for attaching additional capsules.

7. The electronic device according to claim 1, wherein the first capsules are mounted on the first distal end mountable section and the second distal end mountable section by a specific locking mechanism, wherein the specific locking mechanism requires a specific orientation for each of the mountable sections.

8. An electronic device, comprising:

a frame configured to be wearable on a user, the frame comprising a bridge portion having a first mountable section, a first arm portion having a first distal end mountable section, and a second arm portion having a second distal end mountable section; and a first capsule configured to be detachably mounted on the first mountable section;

a plurality of second capsules, each configured to be respectively detachably mounted on the first distal end mountable section and the second distal end mountable section, wherein each of the second capsules has a first end and a second end opposite to each other, and the first end is detachably mounted to the frame wherein the first and second capsules are connected to each other by an external cable;

a plurality of third capsules, each configured to be detachably mounted to the second end of the corresponding second capsule through the external cable, wherein the plurality of first, second, and third capsules respectively encloses an imaging capture unit, a controller, a communication interface, or a battery, and wherein the imaging capture unit is configured to capture images.

9. The electronic device according to claim 8, wherein the bridge portion is configured to be supported by the nose of a user, the first arm portion has a first free end supported by an ear of the user, and the second arm portion has a second free end supported by the other ear of the user.

10. The electronic device according to claim 8, wherein the second capsules mounted on the first distal end mountable section and the second distal end mountable section are configured to have substantially a same weight by defining the volumes of the components inside the second capsules mounted on the first distal end mountable section and the second distal end mountable section, matching the dimensions of the components, comparing the weights of the components, and distributing the components to balance the weight of the second capsules mounted on the first distal end mountable section and the second distal end mountable section.

11. The electronic device according to claim 8, wherein the electronic device further comprises:

a plurality of light indicators disposed on a surface of the frame of the electronic device facing the user; and a plurality of covers configured to be respectively detachably mounted on the first mountable section, the first distal end mountable section and the second distal end mountable section when the first and second capsules are not mounted.

12. The electronic device according to claim 8, wherein each of the first, second and third capsules comprises an external connector for attaching additional capsules.

13. The electronic device according to claim 8, wherein the first and second capsules are respectively mounted on the on the first mountable section, the first and second mountable sections by a specific locking mechanism, wherein the specific locking mechanism requires a specific orientation for each of the mountable sections.

14. The electronic device according to claim 8, wherein the cable contain integrated wires for electrical connection between the first, second and third capsules.

15. The electronic device according to claim 14, wherein the cable connecting the first and second capsules mounted on the frame is disposed on a side of the frame facing the user.

* * * * *